United States Patent
Kim

(10) Patent No.: US 9,222,979 B2
(45) Date of Patent: Dec. 29, 2015

(54) ON-CHIP CONTROLLER AND A SYSTEM-ON-CHIP

(71) Applicant: SAMSUNG ELECTRONICS CO., LTD., Suwon-si, Gyeonggi-do (KR)

(72) Inventor: Dae-Woong Kim, Seoul (KR)

(73) Assignee: SAMSUNG ELECTRONICS CO., LTD., Suwon-Si, Gyeonggi-Do (KR)

( * ) Notice: Subject to any disclaimer, the term of this patent is extended or adjusted under 35 U.S.C. 154(b) by 98 days.

(21) Appl. No.: 14/096,474

(22) Filed: Dec. 4, 2013

(65) Prior Publication Data

US 2014/0164860 A1 Jun. 12, 2014

(30) Foreign Application Priority Data

Dec. 12, 2012 (KR) .................. 10-2012-0144197

(51) Int. Cl.
*G01R 31/28* (2006.01)
*G01R 31/3185* (2006.01)

(52) U.S. Cl.
CPC *G01R 31/318536* (2013.01); *G01R 31/318552* (2013.01); *G01R 31/318555* (2013.01)

(58) Field of Classification Search
CPC ............... G02R 31/318536; G02R 31/318552; G02R 31/318555
See application file for complete search history.

(56) References Cited

U.S. PATENT DOCUMENTS

| | | | |
|---|---|---|---|
| 7,155,651 B2 | 12/2006 | Nadeau-Dostie et al. | |
| 7,197,725 B2 | 3/2007 | Takeoka et al. | |
| 7,380,189 B2 | 5/2008 | Konuk | |
| 7,698,613 B2 | 4/2010 | Kudo | |
| 7,793,179 B2 | 9/2010 | Sul | |
| 7,810,003 B2 | 10/2010 | Seong | |
| 2003/0009714 A1 | 1/2003 | Evans | |
| 2008/0282110 A1 | 11/2008 | Guettaf | |
| 2010/0011264 A1* | 1/2010 | Pugliesi-Conti et al. | 714/731 |
| 2010/0146349 A1 | 6/2010 | Asou | |
| 2012/0124423 A1* | 5/2012 | Chakravadhanula et al. | 714/27 |

FOREIGN PATENT DOCUMENTS

| | | |
|---|---|---|
| JP | 2006-084314 | 3/2006 |
| JP | 2009-079913 | 4/2009 |
| JP | 2009-210544 | 9/2009 |
| KR | 1020090047027 | 5/2009 |

* cited by examiner

*Primary Examiner* — Sam Rizk
(74) *Attorney, Agent, or Firm* — F. Chau & Associates, LLC

(57) ABSTRACT

An on-chip clock controller includes a clock-control chain configured to shift first clock-control bits in serial and output the first clock-control bits to a first clock domain in parallel in response to a clock-control scan clock provided from outside of a chip, and a first domain clock generator, the first domain clock generator configured, during a test mode, to generate a first internal clock by selectively outputting a first data scan clock provided from outside of the chip or a first functional clock generated from inside of the chip.

18 Claims, 3 Drawing Sheets

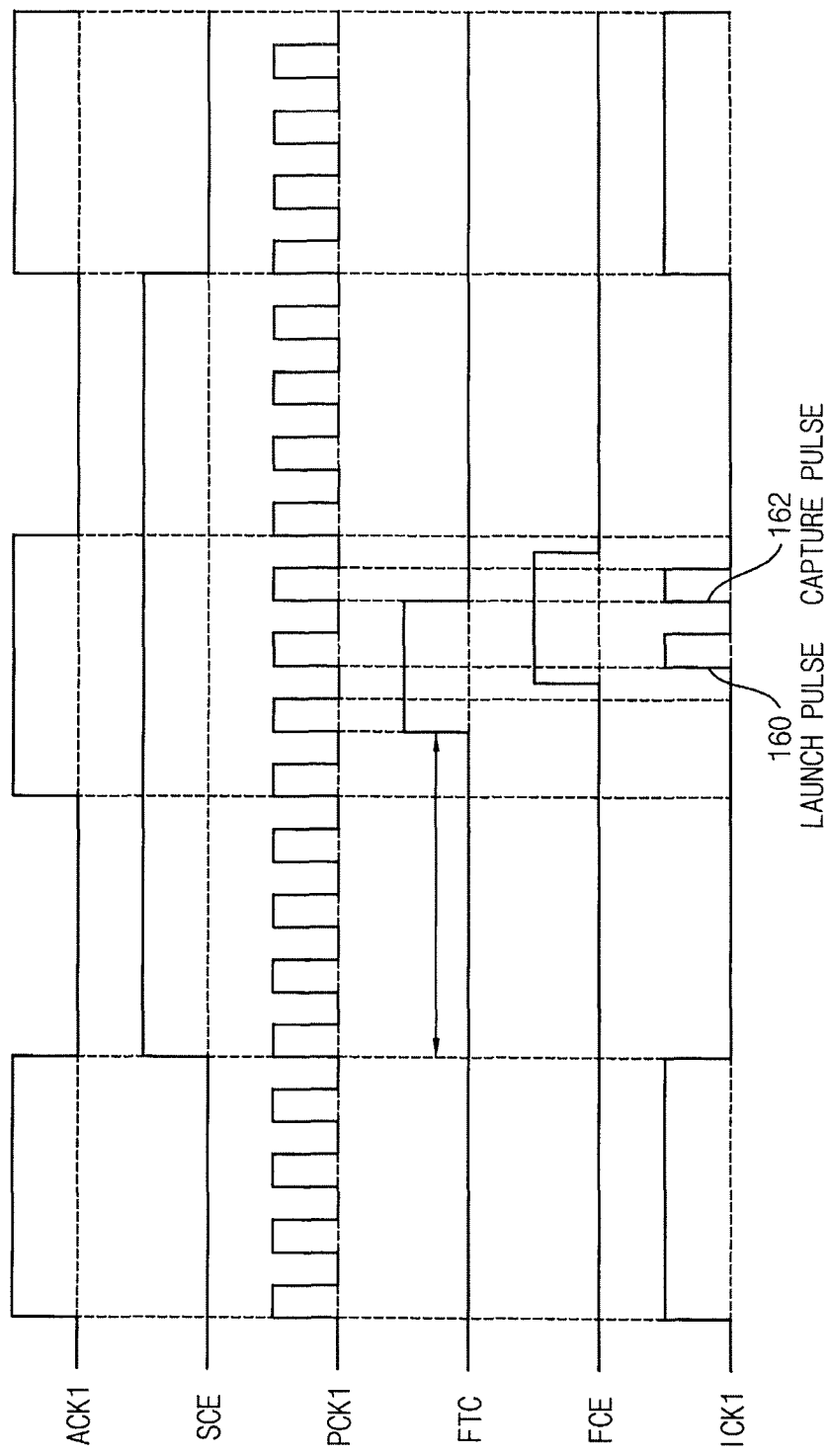

ON-CHIP CONTROLLER AND A SYSTEM-ON-CHIP

CROSS-REFERENCE TO RELATED APPLICATION

This U.S. non-provisional patent application claims priority under 35 U.S.C. §119 to Korean Patent Application No. 10-2012-0144197 filed on Dec. 12, 2012 in the Korean Intellectual Property Office (KIPO), the disclosure of which is incorporated by reference herein in its entirety.

BACKGROUND

1. Technical Field

The inventive concept relates to electronic devices. More particularly, the inventive concept relates to on-chip clock controllers and system-on-chips (SOCs).

2. Discussion of the Related Art

An at-speed test may be used to detect a transition delay fault as well as a stuck-at fault in a system-on-chip (SOC) or other electronic devices. The at-speed test may apply a high-speed clock used for normal operation to capture data with a real operating frequency while simultaneously performing a scan operation using a slow scan clock in a scan mode.

For the at-speed test, an on-chip clock controller (OCCC) of a SOC may be employed by a test tool, for example, DFTMAX by Synopsys, Inc., to use the SOC's internal phase locked loop (PLL). The OCCC may be located in each group where circuits using the same clock are grouped into a clock domain.

The OCCC may generate, launch, and capture clocks based on a slow scan clock provided from automatic test equipment (ATE) and a high-speed clock generated by the internal PLL.

Power management may be considered during a manufacturing test. This is so, because as circuit geometry is reduced and threshold voltages become lower, the reliability of a digital integrated circuit (IC) can be adversely affected by excessive power consumption during the test. For example, such factors may result in an initial test failure and a false failure during a final test.

SUMMARY

Exemplary embodiments of the inventive concept provide an on-chip clock controller capable of reducing power consumption during a scan test and reducing yield loss by securing a low voltage margin.

Exemplary embodiments of the inventive concept provide a system-on-chip (SOC) capable of reducing power consumption during a scan test and reducing yield loss by securing a low voltage margin.

According to an exemplary embodiment of the inventive concept, an on-chip clock controller includes a clock-control chain configured to shift first clock-control bits in serial and output the first clock-control bits to a first clock domain in parallel in response to a clock-control scan clock provided from outside of a chip, and a first domain clock generator, the first domain clock generator configured, during a test mode, to generate a first internal clock by selectively outputting a first data scan clock provided from outside of the chip or a first functional clock generated from inside of the chip.

In an exemplary embodiment of the inventive concept, the first domain clock generator may include a timing control logic circuit configured to be initialized in response to a scan clock enable signal, and generate a functional clock enable timing control signal in response to the first clock-control bits, a scan clock enable register configured to generate the scan clock enable signal synchronized with the first data scan clock in response to a scan mode signal, a scan clock gate configured to gate the first data scan clock in response to the scan clock enable signal, a functional clock enable register configured to generate a functional clock enable signal synchronized with the first functional clock in response to the scan mode signal and the functional clock enable timing control signal, a first multiplexer configured to selectively output the first data scan clock provided from the scan clock gate or the first functional clock in response to the functional clock enable signal, and a second multiplexer configured to selectively output, as the first internal clock, a clock outputted from the first multiplexer or the first functional clock in response to a test mode signal.

In an exemplary embodiment of the inventive concept, the scan clock enable register and the functional clock enable register may be coupled to form a bi-stable latch.

In an exemplary embodiment of the inventive concept, the timing control logic circuit may be initialized in response to the scan clock enable signal to count the first functional clock, and may generate the functional clock enable timing control signal after counting a predetermined number of periods of the first functional clock.

In an exemplary embodiment of the inventive concept, the first clock-control bits may include two bits, the first clock-control bits may set an operating mode to a disable mode when the two bits are '00,' set the operating mode to a capture mode when the two bits are '01,' set the operating mode to a launch mode when the two bits are '10,' and set the operating mode to a double capture mode when the two bits are '11.'

The clock-control chain may be configured to shift second clock-control bits in serial and output the second clock-control bits to a second clock domain in parallel in response to the clock-control scan clock, the on-chip clock controller may further include: a second domain clock generator, the second domain clock generator configured, during the test mode, to generate a second internal clock by selectively outputting a second data scan clock provided from outside of the chip or a second functional clock generated from inside of the chip.

The chip may be a SOC that includes the on-chip clock controller.

According to an exemplary embodiment of the inventive concept, a SOC includes a first clock domain, the first clock domain including a first circuit under test and a first data scan chain, a functional clock generator configured to generate a first functional clock corresponding to the first circuit under test included in the first clock domain, a clock-control chain configured to shift first clock-control bits in serial and output the first clock-control bits to the first clock domain in parallel in response to a clock-control scan clock, and a first domain clock generator, the first domain clock generator configured, during a test mode, to generate a first internal clock by selectively outputting a first data scan clock or a the first functional clock.

In an exemplary embodiment of the inventive concept, the SOC may have a first clock input terminal for receiving the clock-control scan clock from outside of the SOC, and a second clock input terminal for receiving the first data scan clock from outside of the SOC.

The clock-control scan clock and the first data scan clock may be provided from a test device.

In an exemplary embodiment of the inventive concept, the first domain clock generator may include a timing control logic circuit configured to be initialized in response to a scan clock enable signal, and generate a functional clock enable timing control signal in response to the first clock-control bits, a scan clock enable register configured to generate the scan clock enable signal synchronized with the first data scan clock in response to a scan mode signal, a scan clock gate configured to gate the first data scan clock in response to the scan clock enable signal, a functional clock enable register configured to generate a functional clock enable signal synchronized with the first functional clock in response to the scan mode signal and the functional clock enable timing control signal, a first multiplexer configured to selectively output the first data scan clock provided from the scan clock gate or the first functional clock in response to the functional clock enable signal, and a second multiplexer configured to selectively output, as the first internal clock, a clock outputted from the first multiplexer or the first functional clock in response to a test mode signal.

In an exemplary embodiment of the inventive concept, the scan clock enable register and the functional clock enable register may be coupled to form a bi-stable latch.

In an exemplary embodiment of the inventive concept, the timing control logic circuit may be initialized in response to the scan clock enable signal to count the first functional clock, and may generate the functional clock enable timing control signal after counting a predetermined number of periods of the first functional clock.

In an exemplary embodiment of the inventive concept, the first clock-control bits may include two bits, the first clock-control bits may set an operating mode to a disable mode when the two bits are '00,' set the operating mode to a capture mode when the two bits are '01,' set the operating mode to a launch mode when the two bits are '10,' and set the operating mode to a double capture mode when the two bits are '11.'

The SOC may further include a second clock domain, the second clock domain including a second circuit under test and a second data scan chain, the functional clock generator may be configured to generate a second functional clock corresponding to the second circuit under test included in the second clock domain, the clock-control chain may be configured to shift second clock-control bits in serial and output the second clock-control bits to the second clock domain in parallel in response to the clock-control scan clock; and a second domain clock generator, the second domain clock generator configured, during a test mode, to generate a second internal clock by selectively outputting a second data scan clock or the second functional clock.

According to an exemplary embodiment of the inventive concept an on-chip clock controller may include a clock setting register pair configured to output clock control bits in response to a clock-control scan clock; and a domain clock generator configured to receive the clock control bits from the clock setting register pair and, in response to a scan mode signal and a test mode signal, select a functional clock or a data scan clock, and output the selected clock as an operating clock of a data scan chain.

The clock-control scan clock may be a low-speed clock.

The clock control bits may control an operating mode of the domain clock generator.

The clock control bits may be provided to the domain clock generator in parallel.

The data scan clock may not be input the clock setting register pair.

BRIEF DESCRIPTION OF THE DRAWINGS

The above and other features of the inventive concept will become more apparent by describing in detail exemplary embodiments thereof with reference to the accompanying drawings.

FIG. 3 is a timing diagram for describing an operation of the domain clock generator of FIG. 2, according to an exemplary embodiment of the inventive concept.

DETAILED DESCRIPTION OF THE EMBODIMENTS

Figure 1:
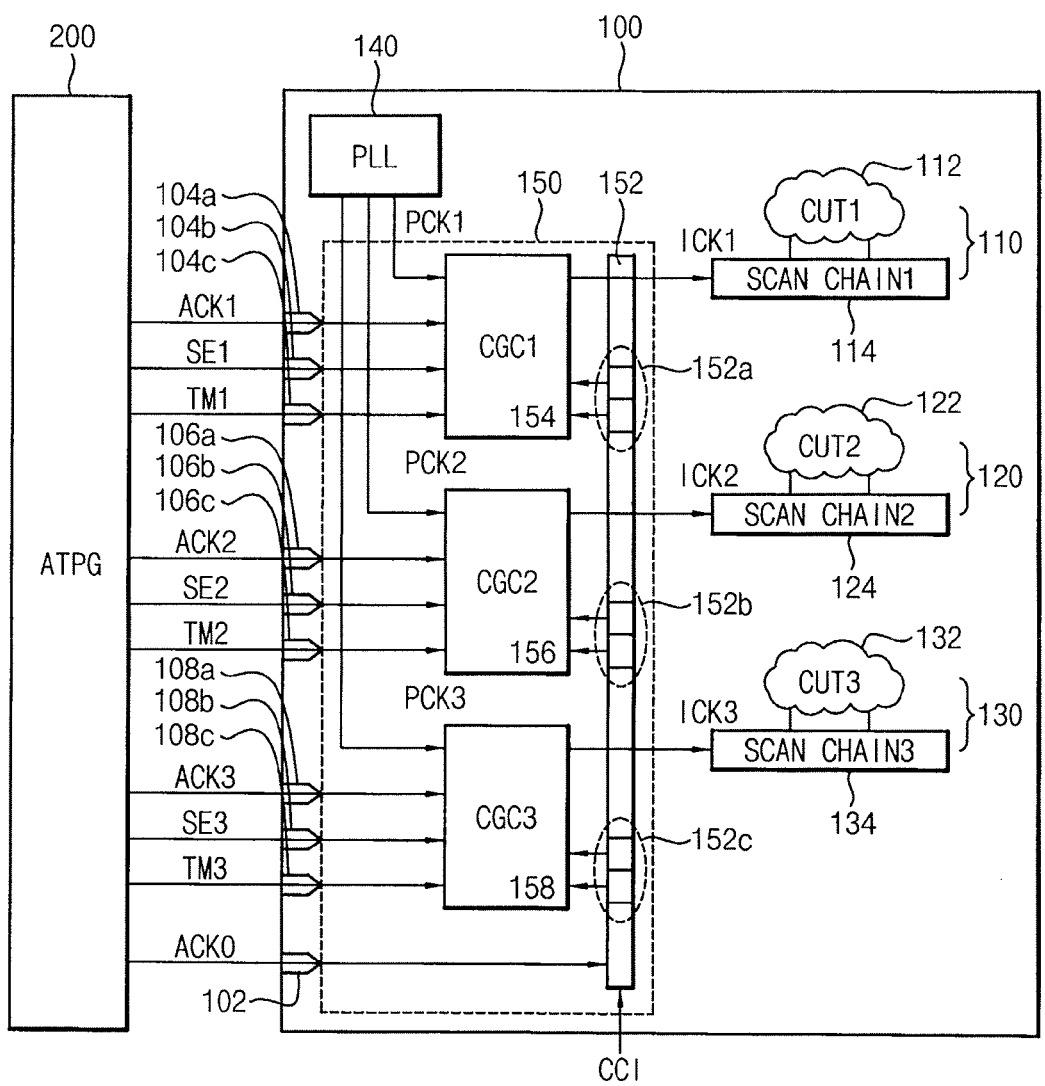
FIG. 1 is a block diagram illustrating a system-on-chip (SOC) having an at-speed test function according to an exemplary embodiment of the inventive concept.

Exemplary embodiments of the inventive concept will be described more fully hereinafter with reference to the accompanying drawings. The present inventive concept may, however, be embodied in many different forms and should not be construed as limited to the exemplary embodiments set forth herein. In the drawings, the sizes of elements may be exaggerated for clarity.

It will be understood that when an element is referred to as being "on," "connected to" or "coupled to" another element, it can be directly on, connected or coupled to the other element or intervening elements may be present. Like reference numerals may refer to like elements throughout this application.

As used herein, the singular forms "a," "an" and "the" are intended to include the plural focus as well, unless the context clearly indicates otherwise.

FIG. 1 is a block diagram illustrating a system-on-chip (SOC) having an at-speed test function according to an exemplary embodiment of the inventive concept.

Referring to FIG. 1, a SOC 100 includes clock domains 110, 120 and 130, a functional clock generator 140 and an on-chip clock controller 150.

Each clock domain 110, 120 and 130 may include a circuit under test (CUT) 112, 122 and 132 and a data scan chain 114, 124 and 134. The CUTs 112, 122 and 132 may be respectively provided with functional clocks PCK1, PCK2 and PCK3 having different clock-speeds from each other. Each data scan chain 114, 124 and 134 may receive a test pattern from test equipment 200, may capture data from its respective CUT 112, 122 and 132, and may output the captured data to the test equipment 200. Here, each of the clock domains 110, 120 and 130 is a circuit region that is synchronized with a particular clock.

The functional clock generator 140 may include a phase locked loop (PLL) circuit that generates the functional clocks PCK1, PCK2 and PCK3. For example, a first functional clock PCK1 may be provided as an operating clock of a first CUT 112 of a first clock domain 110, a second functional clock PCK2 may be provided as an operating clock of a second CUT 122 of a second clock domain 120, and a third functional clock PCK3 may be provided as an operating clock of a third CUT 132 of a third clock domain 130.

The on-chip clock controller 150 may include a clock-control chain 152 and domain clock generators (CGC1, CGC2 and CGC3) 154, 156 and 158.

The clock-control chain 152 may include clock setting register pairs 152a, 152b and 152c connected in series with each other to perform a scan shift operation. Each register in the clock setting register pairs 152a, 152b and 152c may receive a clock-control scan clock ACK0 as a clock input, and may output a clock-control output signal CCO by shifting a clock-control input signal CCI. The clock-control input signal CCI may be provided from the test equipment 200, and the clock-control output signal CCO may be provided to the test equipment 200. The clock-control scan clock ACK0 may be received at an input terminal 102 of the SOC 100 from the test equipment 200. For example, a first clock setting register pair 152a may provide a first domain clock generator 154 with first clock-control bits in parallel, a second clock setting register pair 152b may provide a second domain clock generator 156 with second clock-control bits in parallel, and a third clock setting register pair 152c may provide a third domain clock generator 158 with third clock-control bits in parallel.

Parallel test modes of the clock domains 110, 120 and 130 may be achieved by controlling operating modes of the domain clock generators 154, 156 and 158 with the clock-control chain 152. The clock-control chain 152 may receive, as a clock input, the separate or additional clock-control scan clock ACK0 that is independent of the clock domains 110, 120 and 130, may receive, as a data input CCI, the clock-control bits in serial, and may output, as a data output CCO, the clock-control bits in parallel. Further, the clock-control bits for testing the clock domains 110, 120 and 130 may be respectively loaded into the domain clock generators 154, 156 and 158 in parallel at each scan chain loading of the clock-control chain 152.

In response to a first scan mode signal SE1 and a first test mode signal TM1, the first domain clock generator 154 may select one of the first functional clock PCK1 and a first data scan clock ACK1, and may output the selected one as a first internal clock ICK1. The first internal clock ICK1 may be provided as an operating clock of a first data scan chain 114.

In response to a second scan mode signal SE2 and a second test mode signal TM2, the second domain clock generator 156 may select one of the second functional clock PCK2 and a second data scan clock ACK2, and may output the selected one as a second internal clock ICK2. The second internal clock ICK2 may be provided as an operating clock of a second data scan chain 124.

In response to a third scan mode signal SE3 and a third test mode signal TM3, the third domain clock generator 158 may select one of the third functional clock PCK3 and a third data scan clock ACK3, and may output the selected one as a third internal clock ICK3. The third internal clock ICK3 may be provided as an operating clock of a third data scan chain 134.

The first data scan clock ACK1, the first scan mode signal SE1 and the first test mode signal TM1 may be provided at input terminals 104a, 104b and 104c of the SOC 100 from the test equipment 200, the second data scan clock ACK2, the second scan mode signal SE2 and the second test mode signal TM2 may be provided at input terminals 106a, 106b and 106c of the SOC 100 from the test equipment 200, and the third data scan clock ACK3, the third scan mode signal SE3 and the third test mode signal TM3 may be provided at input terminals 108a, 108b and 108c of the SOC 100 from the test equipment 200.

The data scan chains 114, 124 and 134 may perform scan unload and load operations independently or dependently from each other. In an exemplary embodiment of the inventive concept, the data scan chains 114, 124 and 134 may have a parallel configuration where the data scan chains 114, 124 and 134 independently operate. Further, the clock domains 110, 120 and 130 may employ the same or different test protocols. For example, to perform a test between domains, the first clock domain 110 may be activated to perform a launch operation, and the second clock domain 120 may be activated to perform a capture operation. The third clock domain 130 may be deactivated to a disable mode (e.g., a static test state). Thus, the clock domains 110, 120 and 130 may perform tests in parallel. This parallel test function may reduce sequential dependence between the clock domains 110, 120 and 130, which results in the reduction of the complexity of the automated test pattern generation (ATPG) of the test equipment 200. Such a parallel domain test configuration may reduce an overall test time and a test data volume by reducing the number of the scan unload and load operations.

Although the SOC 100 shown in FIG. 1 includes the three clock domains 110, 120 and 130, according to an exemplary embodiment of the inventive concept the SOC 100 may include one, two, four or more clock domains. The number of domain clock generators included in the SOC 100 may correspond to the number of clock domains of the SOC 100.

The clock-control scan clock ACK0 may be provided at the input terminal 102 of the SOC 100 and input to the clock-control chain 152, and the data scan clocks ACK1, ACK2 and ACK3 may be provided at the input terminals 104a, 106a and 108a of the SOC 100 and input to the corresponding data scan chains 114, 124 and 134.

In a conventional SOC, the data scan clocks ACK1, ACK2 and ACK3 are provided as clock inputs to the clock setting register pairs 152a, 152b and 152c, and to at least a portion of flip-flops of the domain clock generators 154, 156 and 158 even during a scan shift operation for the clock-control bits, which results in unnecessary power consumption. Further, if the number of the clock domains 110, 120 and 130 increases from about 100 to about 200, unnecessary power consumption may be considerably increased.

However, the clock-control chain 152 according to an exemplary embodiment of the inventive concept may receive the separate or additional clock-control scan clock ACK0 during the scan shift operation for the clock-control bits, and thus only flip-flops of the clock-control chain 152 may operate during the scan shift operation while the flip-flops of the domain clock generators 154, 156 and 158 are deactivated. Accordingly, unnecessary power consumption may be reduced.

Figure 2:
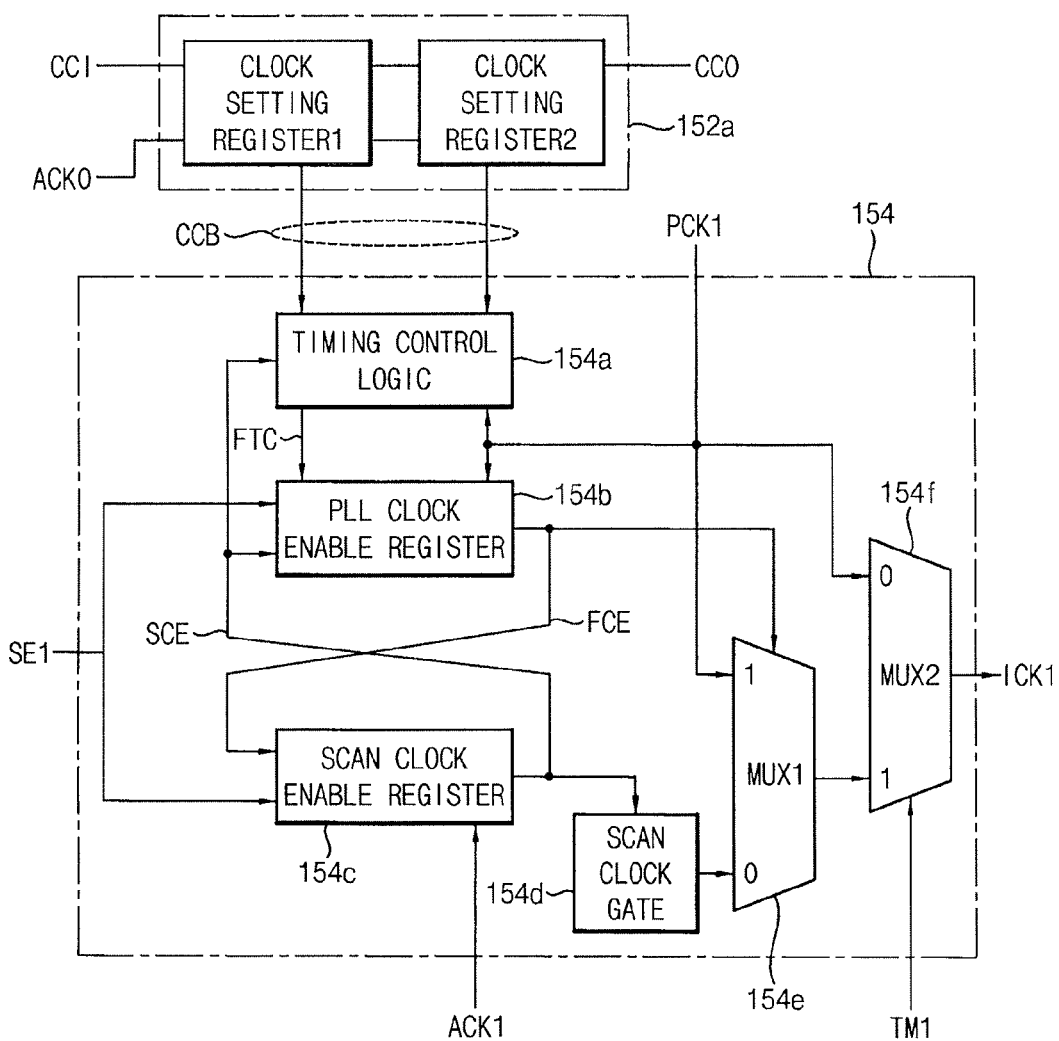
FIG. 2 is a block diagram illustrating a domain clock generator included in the SOC of FIG. 1 according to an exemplary embodiment of the inventive concept.

FIG. 2 is a block diagram illustrating a domain clock generator included in the SOC 100 of FIG. 1 according to an exemplary embodiment of the inventive concept.

Referring to FIG. 2, a domain clock generator 154 includes a timing control logic circuit 154a, a functional clock enable register 154b, a data scan clock enable register 154c, a scan clock gate 154d, a first multiplexer 154e and a second multiplexer 154f.

The timing control logic circuit 154a may be initialized in response to a scan clock enable signal SCE, and may generate a functional clock enable timing control signal FTC in response to corresponding clock-control bits CCB. The timing control logic circuit 154a may control timing by counting a corresponding functional clock PCK1 after the initialization. The clock-control bits CCB may include two bits for a double capture method, and may be used to set operating modes as shown in the following Table 1.

TABLE 1

| Clock-Control Bits | Operating Mode |
| --- | --- |
| 00 | Disabled |
| 01 | Capture Mode |
| 10 | Launch Mode |
| 11 | Double Capture Mode |

The functional clock enable register 154b may generate a functional clock enable signal FCE that is synchronized with the functional clock PCK1 in response to a scan mode signal SE1 and the functional clock enable timing control signal FTC.

The scan clock enable register 154c may generate the scan clock enable signal SCE that is synchronized with a corresponding data scan clock ACK1 in response to the scan mode signal SE1.

The scan clock gate 154d may gate or selectively output the data scan clock ACK1 in response to the scan clock enable signal SCE.

The first multiplexer 154e may selectively output the data scan clock ACK1 from the scan clock gate 154d or the functional clock PCK1 in response to the functional clock enable signal FCE.

The second multiplexer 154f may selectively output a clock from the first multiplexer 154e or the functional clock PCK1 in response to a test mode signal TM1.

An input of the scan clock enable register 154c may be gated by the functional clock enable signal FCE, and an input of the functional clock enable register 154b may be gated by the scan clock enable signal SCE. Thus, the scan clock enable register 154c and the functional clock enable register 154b are coupled to form a bi-stable latch.

FIG. 2 further illustrates the first clock setting register pair 152a. The first clock setting register pair 152a includes clock setting register 1 and clock setting register 2. The second and third clock setting register pairs 152b and 152c may be configured accordingly. The clock-control bits CCB provided to the timing control logic 154a are provided from the first clock setting register pair 152a.

FIG. 3 is a timing diagram for describing the domain clock generator 154 of FIG. 2, according to an exemplary embodiment of the inventive concept.

Referring to FIGS. 2 and 3, the scan clock enable register 154c may generate the scan clock enable signal SCE in synchronization with the data scan clock ACK1 in response to the scan mode signal SE1. The scan clock gate 154d may block the data scan clock ACK1 so as not to be applied to the first multiplexer 154e in response to the scan clock enable signal SCE.

The timing control logic circuit 154a may be initialized in response to the scan clock enable signal SCE, may count the functional clock PCK1, and may generate the timing control signal FTC when a predetermined number of periods of the functional clock PCK1 is counted. As shown in FIG. 3, the predetermined number of periods of the functional clock PCK1 corresponds to the arrow. The predetermined number shown in FIG. 3 is an example and may be more or less than that shown.

In response to the timing control signal FTC, the functional clock enable register 154b may generate the functional clock enable signal FCE that is delayed by a half of a period of the functional clock PCK1.

The first multiplexer 154e may selectively output the data scan clock ACK1 or the functional clock PCK1 in response to the functional clock enable signal FCE. While the functional clock enable signal FCE has a high level, the functional clock PCK1 is output from the first multiplexer 154e. While the functional clock enable signal FCE has a low level, the data scan clock ACK1 is output from the first multiplexer 154e. In response to the test mode signal TM1, the second multiplexer 154f may output an output of the first multiplexer 154e during a test mode (e.g., TM1=1). Thus, the second multiplexer 154f may provide the internal clock ICK1 as a scan clock of the data scan chain 114 of the clock domain 110. Accordingly, the data scan chain 114 may perform a scan shift operation on data based on the data scan clock ACK1, may perform a launch operation at an edge 160 of a first pulse of the functional clock PCK1, and may perform a capture operation at an edge 162 of a second pulse of the functional clock PCK1.

To employ an exemplary embodiment of the present inventive concept, a dedicated low-speed clock input pad for the clock-control chain 152 may be added during the design of the SOC 100, and a test scan protocol file in the test equipment 200 may be modified to interface with the dedicated low-speed clock input pad.

Although the SOC described above with reference to FIGS. 1 to 3 includes three clock domains, it will be appreciated that the scan test according to an exemplary embodiment of the present inventive concept may be performed on SOCs having one, two, four or more clock domains.

The on-chip clock controller and the SOC according to exemplary embodiments of the inventive concept may secure a low voltage (LVcc) margin of the SOC by reducing unnecessary power consumption during an at-speed test for the SOC including multiple clock domains, thereby reducing yield loss.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

What is claimed is:

1. An on-chip clock controller, comprising:
   a clock-control chain configured to shift first clock-control bits in serial and output the first clock-control bits to a first clock domain in parallel in response to a clock-control scan clock provided from outside of a chip; and
   a first domain clock generator, the first domain clock generator configured, during a test mode, to generate a first internal clock by selectively outputting a first data scan clock provided from outside of the chip or a first functional clock generated from inside of the chip,
   wherein the first domain clock generator comprises:
   a timing control logic circuit configured to be initialized in response to a scan clock enable signal, and generate a functional clock enable timing control signal in response to the first clock-control bits;
   a scan clock enable register configured to generate the scan clock enable signal synchronized with the first data scan clock in response to a scan mode signal;
   a scan clock gate configured to gate the first data scan clock in response to the scan clock enable signal;
   a functional clock enable register configured to generate a functional clock enable signal synchronized with the first functional clock in response to the scan mode signal and the functional clock enable timing control signal;
   a first multiplexer configured to selectively output the first data scan clock provided from the scan clock gate or the first functional clock in response to the functional clock enable signal; and
   a second multiplexer configured to selectively output, as the first internal clock, a clock outputted from the first multiplexer or the first functional clock in response to a test mode signal.

2. The on-chip clock controller of claim 1, wherein the scan clock enable register and the functional clock enable register are coupled to form a bi-stable latch.

3. The on-chip clock controller of claim 1, wherein the timing control logic circuit is initialized in response to the scan clock enable signal to count the first functional clock, and generates the functional clock enable timing control signal after counting a predetermined number of periods of the first functional clock.

4. The on-chip clock controller of claim 1, wherein the first clock-control bits include two bits, wherein the first clock control bits set an operating mode to a disable mode when the two bits are '00,' set the operating mode to a capture mode when the two bits are '01,' set the operating mode to a launch mode when the two bits are '10' and set the operating mode to a double capture mode when the two bits are 'H'.

5. The on-chip clock controller of claim 1, wherein the clock-control chain is configured to shift second clock-control bits in serial and output the second clock-control bits to a second clock domain in parallel in response to the clock-control scan clock, the on-chip clock controller further comprising:

a second domain clock generator, the second domain clock generator configured, during the test mode, to generate a second internal clock by selectively outputting a second data scan clock provided from outside of the chip or a second functional clock generated from inside of the chip.

6. The on-chip clock controller of claim 1, wherein the chip is a system-on-chip that includes the on-chip clock controller.

7. A system-on-chip, comprising:

a first clock domain, the first clock domain including a first circuit under test and a first data scan chain;

a functional clock generator configured to generate a first functional clock corresponding to the first circuit under test included in the first clock domain;

a clock-control chain configured to shift first clock-control bits in serial and output the first clock-control bits to the first clock domain in parallel in response to a clock-control scan clock; and a first domain clock generator, the first domain clock generator configured, during a test mode, to generate a first internal clock by selectively outputting a first data scan clock or the first functional clock, wherein the first domain clock generator comprises:

a timing control logic circuit configured to be initialized in response to a scan clock enable signal, and generate a functional clock enable timing control signal in response to the first clock-control bits;

a scan clock enable register configured to generate the scan clock enable signal synchronized with the first data scan clock in response to a scan mode signal;

a scan clock gate configured to gate the first data scan clock in response to the scan clock enable signal;

a functional clock enable register configured to generate a functional clock enable signal synchronized with the first functional clock in response to the scan mode signal and the functional clock enable timing control signal;

a first multiplexer configured to selectively output the first data scan clock provided from the scan clock gate or the first functional clock in response to the functional clock enable signal; and a second multiplexer configured to selectively output, as the first internal clock, a clock outputted from the first multiplexer or the first functional clock in response to a test mode signal.

8. The system-on-chip of claim 7, wherein the system-on-chip has a first clock input terminal for receiving the clock-control scan clock from outside of the system-on-chip, and a second clock input terminal for receiving the first data scan clock from outside of the system-on-chip.

9. The system-on-chip of claim 7, wherein the clock-control scan clock and the first data scan clock is provided from a test device.

10. The system-on-chip of claim 7, wherein the scan clock enable register and the functional clock enable register are coupled to form a bi-stable latch.

11. The system-on-chip of claim 7, wherein the timing control logic circuit is initialized in response to the scan clock enable signal to count the first functional clock, and generates the functional clock enable timing control signal after counting a predetermined number of periods of the first functional clock.

12. The system-on-chip of claim 7, wherein the first clock-control bits include two bits, wherein the first clock-control bits set an operating mode to a disable mode when the two bits are '00,' set the operating mode to a capture mode when the two bits are '01,' set the operating mode to a launch mode when the two bits are '10,' and set the operating mode to a double capture mode when the two bits are 'H'.

13. The system-on-chip of claim 7, further comprising:

a second clock domain, the second clock domain including a second circuit under test and a second data scan chain, the functional clock generator is configured to generate a second functional clock corresponding to the second circuit under test included in the second clock domain, the clock-control chain is configured to shift second clock-control bits in serial and output the second clock-control bits to the second clock domain in parallel in response to the clock-control scan clock; and a second domain clock generator, the second domain clock generator configured, during a test mode, to generate a second internal clock by selectively outputting a second data scan clock or the second functional clock.

14. An on-chip clock controller, comprising:

a plurality of clock setting registers configured to output clock control bits in response to a clock-control scan clock; and a domain clock generator configured to receive the clock control bits from the plurality of clock setting registers and, in response to a scan mode signal and a test mode signal, select a functional clock or a data scan clock, and output the selected clock as an operating clock of a data scan chain, wherein the domain clock generator comprises:

a timing control logic circuit configured to be initialized in response to a scan clock enable signal, and generate a functional clock enable timing control signal in response to the clock control bits;

a scan clock enable register configured to generate the scan clock enable signal synchronized with the data scan clock in response to the scan mode signal;

a scan clock gate configured to gate the data scan clock in response to the scan clock enable signal;

a functional clock enable register configured to generate a functional clock enable signal synchronized with the functional clock in response to the scan mode signal and the functional clock enable timing control signal;

a first multiplexer configured to selectively output the data scan clock provided from the scan clock gate or the functional clock in response to the functional clock enable signal; and a second multiplexer configured to selectively output, as the operating clock, a clock outputted from the first multiplexer or the functional clock in response to the test mode signal.

15. The on-chip clock controller of claim 14, wherein the clock-control scan clock is a low-speed clock.

16. The on-chip clock controller of claim 14, wherein the clock control bits control an operating mode of the domain clock generator.

17. The on-chip clock controller of claim 14, wherein the clock control bits are provided to the domain clock generator in parallel.

18. The on-chip clock controller of claim 14, wherein the data scan clock is not input to the plurality of clock setting registers.

* * * * *